(12) United States Patent
Feler et al.

(10) Patent No.: US 12,013,634 B2
(45) Date of Patent: Jun. 18, 2024

(54) REDUCTION OR ELIMINATION OF PATTERN PLACEMENT ERROR IN METROLOGY MEASUREMENTS

(71) Applicant: KLA-TENCOR CORPORATION, Milpitas, CA (US)

(72) Inventors: Yoel Feler, Haifa (IL); Vladimir Levinski, Migdal HaEmek (IL); Roel Gronheid, Leuven (BE); Sharon Aharon, Hanaton (IL); Evgeni Gurevich, Yokneam Illit (IL); Anna Golotsvan, Qiryat Tivon (IL); Mark Ghinovker, Yoqneam llit (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 18/076,375

(22) Filed: Dec. 6, 2022

(65) Prior Publication Data

US 2023/0099105 A1 Mar. 30, 2023

Related U.S. Application Data

(60) Division of application No. 17/161,645, filed on Jan. 28, 2021, now Pat. No. 11,537,043, which is a
(Continued)

(51) Int. Cl.
*G03F 1/84* (2012.01)
*G01N 21/00* (2006.01)
(Continued)

(52) U.S. Cl.
CPC ............... *G03F 1/84* (2013.01); *G01N 21/00* (2013.01); *G03F 1/26* (2013.01); *G03F 1/44* (2013.01);
(Continued)

(58) Field of Classification Search
USPC ........................................................ 382/144
See application file for complete search history.

(56) References Cited

U.S. PATENT DOCUMENTS 7,075,639 B2 * 7/2006 Adel .......................... G03F 1/30
356/399
7,368,208 B1 * 5/2008 Adel .......................... G03F 1/84
430/30

(Continued)

*Primary Examiner* — Mohammed Alam
(74) *Attorney, Agent, or Firm* — Hodgson Russ LLP

(57) ABSTRACT

Metrology methods and targets are provided for reducing or eliminating a difference between a device pattern position and a target pattern position while maintaining target printability, process compatibility and optical contrast—in both imaging and scatterometry metrology. Pattern placement discrepancies may be reduced by using sub-resolved assist features in the mask design which have a same periodicity (fine pitch) as the periodic structure and/or by calibrating the measurement results using PPE (pattern placement error) correction factors derived by applying learning procedures to specific calibration terms, in measurements and/or simulations. Metrology targets are disclosed with multiple periodic structures at the same layer (in addition to regular target structures), e.g., in one or two layers, which are used to calibrate and remove PPE, especially when related to asymmetric effects such as scanner aberrations, off-axis illumination and other error sources.

11 Claims, 6 Drawing Sheets

Related U.S. Application Data continuation of application No. 15/776,588, filed as application No. PCT/US2018/027691 on Apr. 16, 2018, now abandoned.

(60) Provisional application No. 62/576,045, filed on Oct. 23, 2017.

(51) Int. Cl.
  *G03F 1/26* (2012.01)
  *G03F 1/44* (2012.01)
  *G03F 7/00* (2006.01)
  *G06F 30/39* (2020.01)

(52) U.S. Cl.
  CPC ...... *G03F 7/70283* (2013.01); *G03F 7/70633* (2013.01); *G03F 7/70683* (2013.01); *G06F 30/39* (2020.01)

(56) References Cited

U.S. PATENT DOCUMENTS

| | | | |
|---|---|---|---|
| 2014/0065733 A1* | 3/2014 | Ausschnitt | G05B 13/02 |
| | | | 438/8 |
| 2014/0141536 A1* | 5/2014 | Levinski | G03F 7/70683 |
| | | | 356/399 |
| 2015/0242558 A1* | 8/2015 | Amit | H01L 21/31058 |
| | | | 716/55 |
| 2015/0346605 A1* | 12/2015 | Den Boef | G03F 9/708 |
| | | | 716/51 |
| 2018/0157784 A1* | 6/2018 | Levinski | G03F 7/70683 |
| 2021/0149296 A1* | 5/2021 | Feler | G03F 1/84 |
| 2022/0011728 A1* | 1/2022 | Zhang | G05B 13/048 |

* cited by examiner

REDUCTION OR ELIMINATION OF PATTERN PLACEMENT ERROR IN METROLOGY MEASUREMENTS

CROSS REFERENCE TO RELATED APPLICATIONS

This application is a divisional application of U.S. patent application Ser. No. 17/161,645 filed on Jan. 28, 2021, which is a continuation of U.S. patent application Ser. No. 15/776,588 filed on May 16, 20218, which is a national stage entry of PCT/US2018/027691 filed Apr. 16, 2018, which claims the benefit of U.S. Provisional Patent Application No. 62/576,045 filed on Oct. 23, 2017, the disclosures of which are incorporated herein by reference in their entirety.

BACKGROUND OF THE INVENTION

1. Technical Field

The present invention relates to the field of metrology, and more particularly, to targets and methods for reducing pattern placement error (PPE).

2. Discussion of Related Art

Metrology measurements utilize a range of targets for measuring various metrology metrics, such as the overlay between target layers. Examples include Standard Box in Box and AIM (advanced imaging metrology targets having periodical gratings with large pitches, e.g. 1500-2500 nm) imaging OVL (overlay) targets, and SCOL (scatterometry overlay) targets (having smaller pitches, e.g., 500-800 nm)—all of which have typical pitches that are much larger than the design rule pitch of the devices, and hence have printability issues and also introduce errors such as the PPE (pattern placement error).

ASC (Archer Self Calibration) algorithms provided in U.S. Pat. No. 9,329,033, which is incorporated herein by reference in its entirety, are used to correct inaccuracy and PPE simultaneously. Device-like targets are provided in U.S. patent application Ser. No. 14/820,917, which is incorporated herein by reference in its entirety, yet face challenges with respect to the optical contrast they provide and their printability.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of reducing a difference between a device pattern position and a target pattern position of at least one periodic structure in a corresponding metrology target, the method comprising adding, to a mask design of the at least one periodic structure, sub-resolved assist features at a same periodicity as, and in continuation of, the at least one periodic structure, wherein the sub-resolved assist features have a CD (critical dimension) smaller than a corresponding printability threshold.

One aspect of the present invention provides a method of reducing PPE discrepancy between a semiconductor device and a corresponding metrology targets, the method comprising: deriving, from multiple target structures and metrology signals measured therefrom, a PPE correction related to asymmetric aberrations, by applying a learning procedure to a calibration term, and adjusting corresponding measurements by the PPE correction.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanism for enhancing metrology measurements accuracy and thereby provide improvements to the technological field of metrology. Target designs and algorithmic approaches are provided for reduction of scanner aberration impact on overlay (OVL) measurement—overcoming prior art disadvantage of prior art target designs which do not allow to satisfy simultaneously the requirements of target printability, process compatibility, measurability (optical contrast) and small pattern placement error (relative to device pattern placement). It is noted that while the disclosure is aimed at optical illumination radiation, it may be extended to applications in which the illumination radiation is at very short wavelengths such as x ray. Advantageously, disclosed embodiments overcome the difficulty posed by the need to use specially designed periodic "proxy" targets with a coarse pitch $P_c$ as metrology targets which are not the devices themselves (which have optically unresolved design rule pitches), the metrology targets having large coarse pitches (typically above 400 nm (e.g., for scatterometry methods), 900 nm (e.g., for imaging methods) or more, compared with device pitches which are typically below 90 nm, but may extend to a few hundreds of nanometers as well) being measured by imaging and/or scatterometry metrology procedures.

Disclosed embodiments remove or reduce the difference between the measured target pattern placement error (PPE), being measured as part of the overlay, and the device pattern placement—which may result from the non-agreeing structural scales of the devices and the metrology targets, and may exceed one or few nm in the prior art. Either or both approaches of target configuration and measurement correction and/or calibration are disclosed below, and may be combined to enhance the measurement accuracy. Disclosed target designs allow a significant relative PPE reduction without compromising on target process compatibility and target measurability (contrast) and disclosed target designs and algorithmic approaches allow on-the-fly PPE corrections. It is noted that while referring below to the overlay as a non-limiting representative metrology metrics, other metrology metrics may be used in the disclosed methods as well. It is emphasized that disclosed approaches are applicable to both imaging metrology (e.g., AIM targets and analogous structures) and scatterometry metrology (e.g., SCOL targets and analogous structures).

Advantageously, disclosed targets remove the CD variation from printed targets, and reduce the PPE associated therewith, which was found to be linked to the scanner aberrations. This discovery helps avoid the sensitivity increase of PPE to scanner aberrations by an order of magnitude which is expressed in the CD variation. The finding that CD variation provides a pure imaginary (phase) addition to amplitudes of first diffraction order and, correspondingly, provides neither focus slopes nor any overlay error magnification, nor requires a specific choice of recipe setup to ensure accurate overlay measurement conditions—is utilized to develop target designs and measurement methods avoiding these factors to identify, isolate, measure and remove the relative PPE to reach a resolution of aberration amplitude measurement which is better than 1 nm.

Metrology methods and targets are provided for reducing or eliminating discrepancies in pattern placement error (PPE) between devices and corresponding metrology targets, while maintaining target printability, process compatibility and optical contrast—in both imaging and scatterometry metrology. Differences between target PPE and device PPE may be reduced by using sub-resolved assist features having a same periodicity as the target's periodic structure and/or by calibrating the measurement results using PPE correction factors derived by applying learning procedures to specific calibration terms, in measurements and/or simulations. Metrology targets are disclosed with multiple periodic structures at the same layer (in addition to regular target structures), e.g., in one or two layers, which are used to calibrate and remove PPE, especially when related to asymmetric effects such as scanner aberrations, off-axis illumination and other error sources.

Certain embodiments reduce or even remove the part of the PPE caused by asymmetric scanner aberrations, to improve the total accuracy of the overlay measurements, while retaining an acceptable measurement performance—by using assist features having the same periodicity as the segmentation pitch; measuring with only second harmonic of the signal; and/or applying calibration schemes to the metrology measurements, as disclosed in detail below. Various embodiments may be implemented in any metrology platform to improve matching with CDSEM (critical dimension scanning electron microscope) overlay measurements (which is the main reference for accuracy of overlay measurement) and to provide overlay values which are more relevant to real devices.

In certain embodiments, disclosed methods and targets may be configured to handle asymmetries caused by scanner aberration(s) (as discussed in a non-limiting example in FIG. 1), by off-axis illumination for EUV (extreme ultraviolet), etc., and possibly enhanced by other factors such as symmetric scanner aberrations (e.g., focus) or micro-loading effects during etching.

Figure 1:
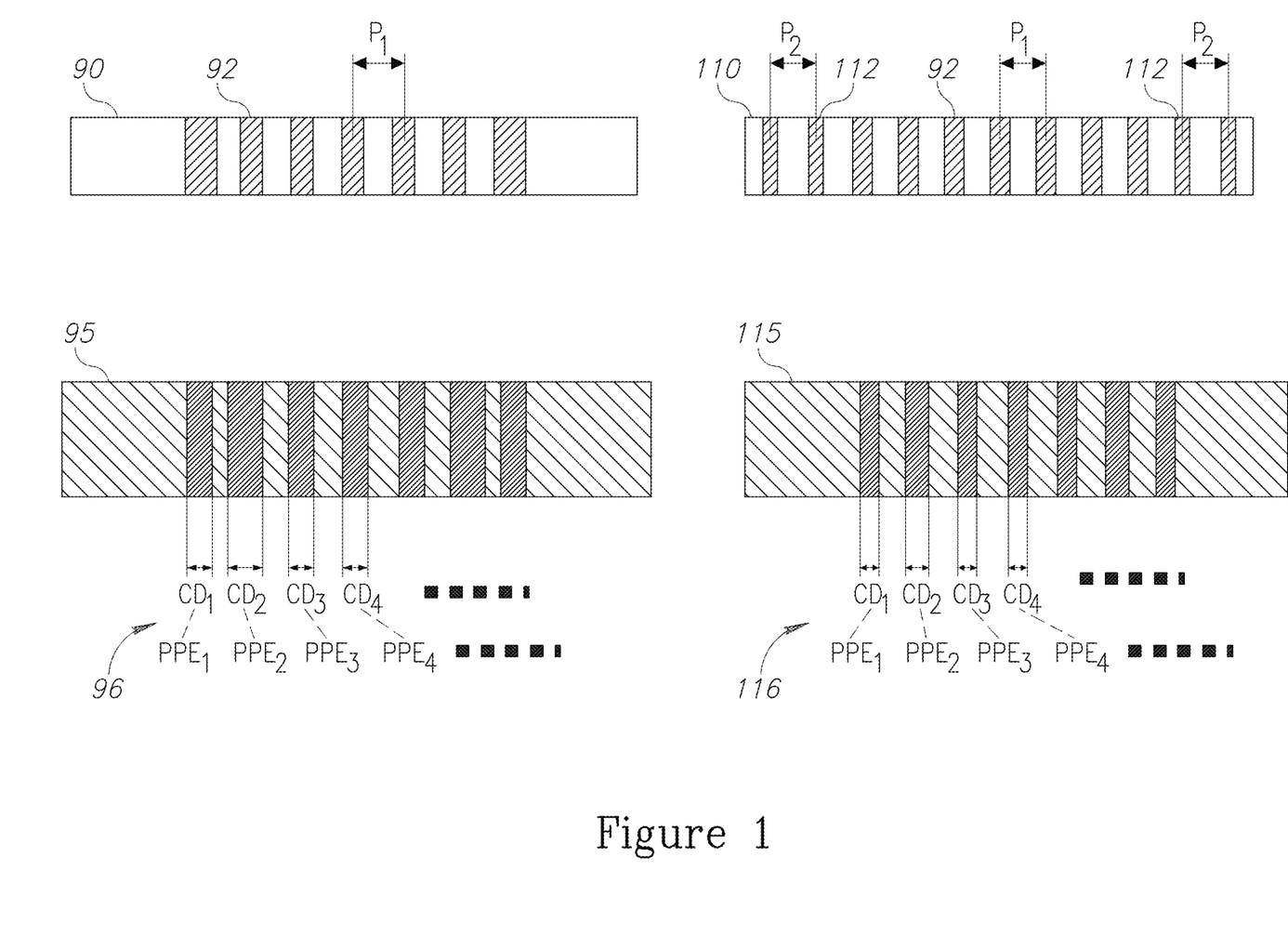
FIG. 1 is a high-level schematic illustration of using assist features in periodic structures for metrology targets on the lithography mask, according to some embodiments of the invention.

FIG. 1 is a high-level schematic illustration of using assist features 112 in periodic structures 110 for metrology targets on the lithography mask, according to some embodiments of the invention. FIG. 1 provides a schematic comparison of target structures designs 90 on the mask having periodic structures 92 at a (fine) pitch $P_1$ which are all printed in the target—with target structures designs 110 on the mask having periodic structures 92 at a pitch $P_1$ which are printed, and assist features 112 at a pitch $P_2$ (e.g., $P_2=P_1$) which are not printed; corresponding printed targets 95, 115 with the printed elements having corresponding CDs (indicated $CD_1$, $CD_2$, $CD_3$, $CD_4$, etc.) and PPEs (indicated $PPE_1$, $PPE_2$, $PPE_3$, $PPE_4$, etc.) denoted 96, 116, respectively; and corresponding pupil images 91, 111.

The inventors have found out that, in certain embodiments, designing targets 110 to have $P_2$ close to $P_1$, or $P_2=P_1$, provides the benefits disclosed below. It is noted that disclosed methods and targets may be applicable for both imaging and scatterometry metrology technologies, providing e.g., more uniform CD and smaller PPE in imaging metrology and more uniform pupil diffraction signals—as illustrated schematically in patterns 95, 115 and 91, 111, respectively.

The inventors have found out a relation between asymmetric scanner aberrations and CD variability, as disclosed below (see Equation 1). For example, for the target elements illustrated in FIG. 1 (e.g., elements from standard segmented AIM targets with pitch $P_c$ between 1.2 and 2.4 µm and coarse CD of ca.

$$\frac{P_c}{2}$$

illustrated without (90, 95, 91) and with (110, 115, 111) sub-resolved assist features (SRAFs) 112 on the mask (110) having pitch $P_2$ which have the same period as the segmentation pitch $P_1$. For target designs 90, CD variability and PPE across pattern 95 are high (e.g., in the order of magnitude of several nm), while for disclosed target designs 110, CD variability and PPE across pattern 115 are low (e.g., less than 1 nm, or less than 0.5 nm). The asymmetry of the aberrations may be expressed by the CD difference between leftmost and rightmost lines of printed patterns 95, 115, which may be e.g., few nm (e.g., ca. 2.5 nm) for printed pattern 95 from target designs 90 lacking assist features; and less than 1 nm (e.g., less than ca. 0.5 nm) for pattern 115 from target designs 110 with assist features 112.

FIG. 1 further presents the diffraction patterns 91, 111 in the pupil plane for respective target designs 90, 110 (the drawings represent one coarse pitch of the target design). The two largest peaks in each of the diagrams correspond to the segmentation pitch (elements of the target's periodic structures may be segmented by a fine pitch $P_1$, which is much smaller than the coarse pitch $P_c$ and approaches the device pitch, in order to enhance target printability) while all other smaller peaks correspond to the coarse pitch $P_c$. The largest diffraction peaks are responsible for the shift of the respective target as a whole (the shift is equal to the device shift due to aberrations when the segmentation pitch is equal or very close to the device pitch), while the other diffraction orders are responsible for CD modulation effects (e.g., the difference between leftmost CD and rightmost CD). As illustrated in pattern 110, adding assist features 112 reduces the amplitudes of the other diffraction orders and therefore provides the assist features configuration which reduces the corresponding CD variability.

Figure 2:
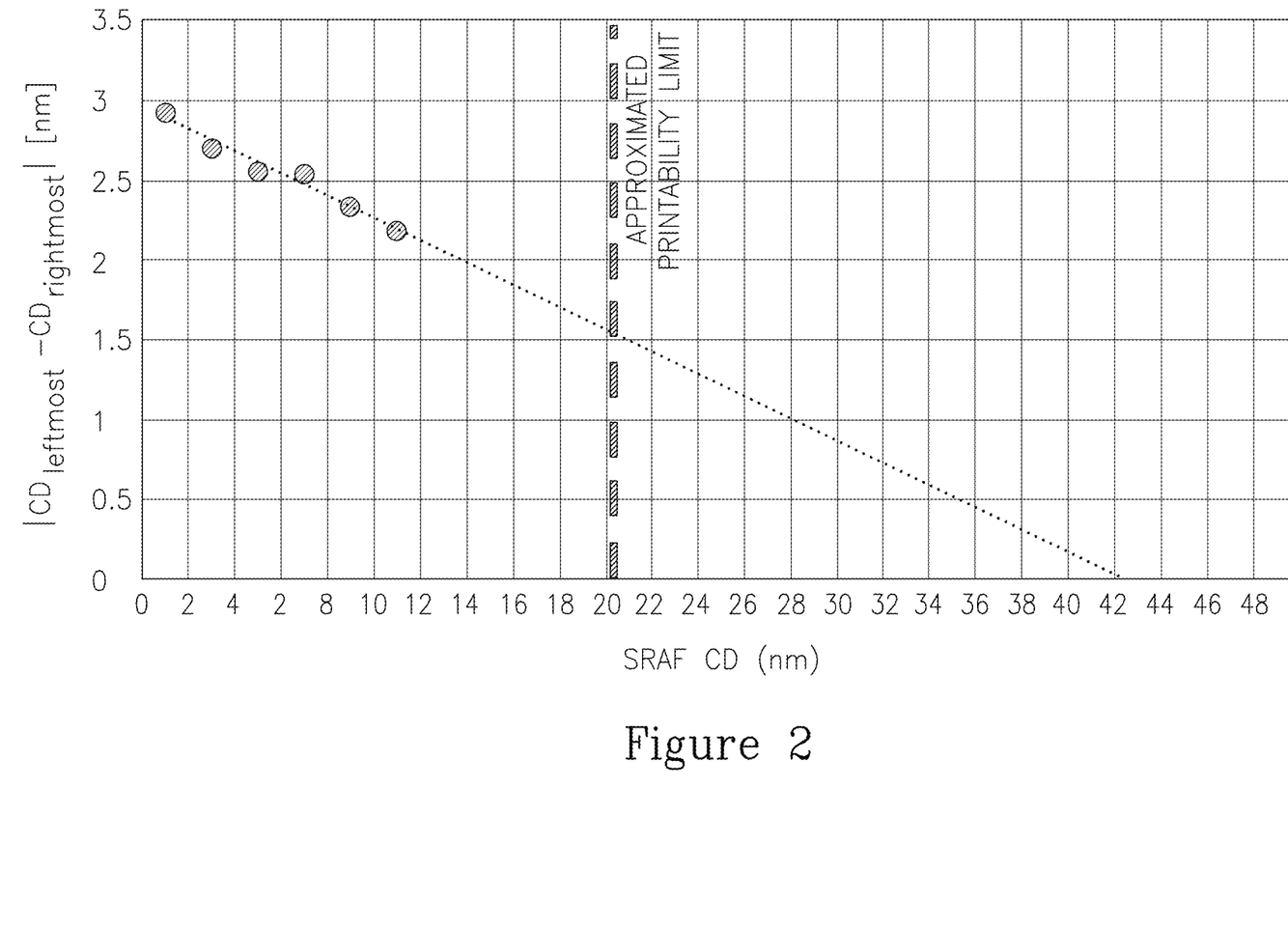
FIG. 2 presents simulation results for the dependency of the difference between the CD values of leftmost and rightmost printed target elements on the CD of assist features (SRAF), according to some embodiments of the invention.

FIG. 2 presents simulation results for the dependency of the difference between the CD values of leftmost and rightmost printed target elements on the CD of assist features 112 (SRAF), according to some embodiments of the invention. The simulation results show that as the size (e.g., CD) of mask assist feature 112 increases, the difference between leftmost and rightmost CD's (asymmetric aberration) decreases, and disappears when the SRAF size (of assist elements 112) approach the size (CD) of the regular line, elements 92, on the mask.

In the following analysis, the inventors have found out that the CD variation provides the main impact on the discrepancy between position of the device pattern and position of the overlay target (as it is observed using the overlay measurement instrument). For example, if there were no CD variations when the target segmentation pitch $P_1$ is chosen to be equal to the device pitch, the overlay target as a whole would be shifted exactly as the device due to the same scanner aberrations. Correspondingly, in this case there would be no discrepancy between positions of device and the overlay target (no PPE discrepancy).

Equation 1 expresses a signal intensity I resulting from an interference between only the zeroth and the $\pm 1^{st}$ diffraction orders, which are captured by an objective lens (for example on a CCD—charge coupled device). $A_0$ and $A_1$ denote the amplitudes of the zeroth and the first diffraction orders respectively, V denotes the phase difference between zeroth and first orders due to target topography and lens focus position, GP denotes the grating position and the term $$\left\{\sum_n \Delta CD_n \cdot \sin\left(\frac{2\pi d_n}{P}\right)\right\} / \left\{\sum_n \overline{CD}_n \cdot \cos\left(\frac{2\pi d_n}{P}\right)\right\}$$

(scanner-aberration-induced term) describes the phase difference between +1 and −1 diffraction orders due to CD variations caused by scanner aberrations, where $\Delta CD_n$ is the CD difference of the $n^{th}$ pair of lines symmetric with respect to the target center, $\overline{CD}_n$ is the average CD value and $d_n$ corresponds to the distance of this pair of lines from the target center.

$$I = \left| A_0 + A_1 \cdot \left[ e^{iV + i\frac{2\pi}{P}GP + i\frac{\sum_n \Delta CD_n \cdot \sin\left(\frac{2\pi d_n}{P}\right)}{2\sum_n \overline{CD}_n \cdot \cos\left(\frac{2\pi d_n}{P}\right)}} + e^{iV - i\frac{2\pi}{P}GP - i\frac{\sum_n \Delta CD_n \cdot \sin\left(\frac{2\pi d_n}{P}\right)}{2\sum_n \overline{CD}_n \cdot \cos\left(\frac{2\pi d_n}{P}\right)}} \right] \right|^2 \quad \text{Equation 1}$$

As expressed in Equation 1, the scanner-aberration-induced term may be interpreted as an additional shift to the true grating position and determines their PPE error due to the aberrations. For the designs presented in FIG. 1, the scanner-aberration-induced term provides an overlay error of about 3.5 nm for target design 90 and about 1 nm for target design 110.

Figure 3:
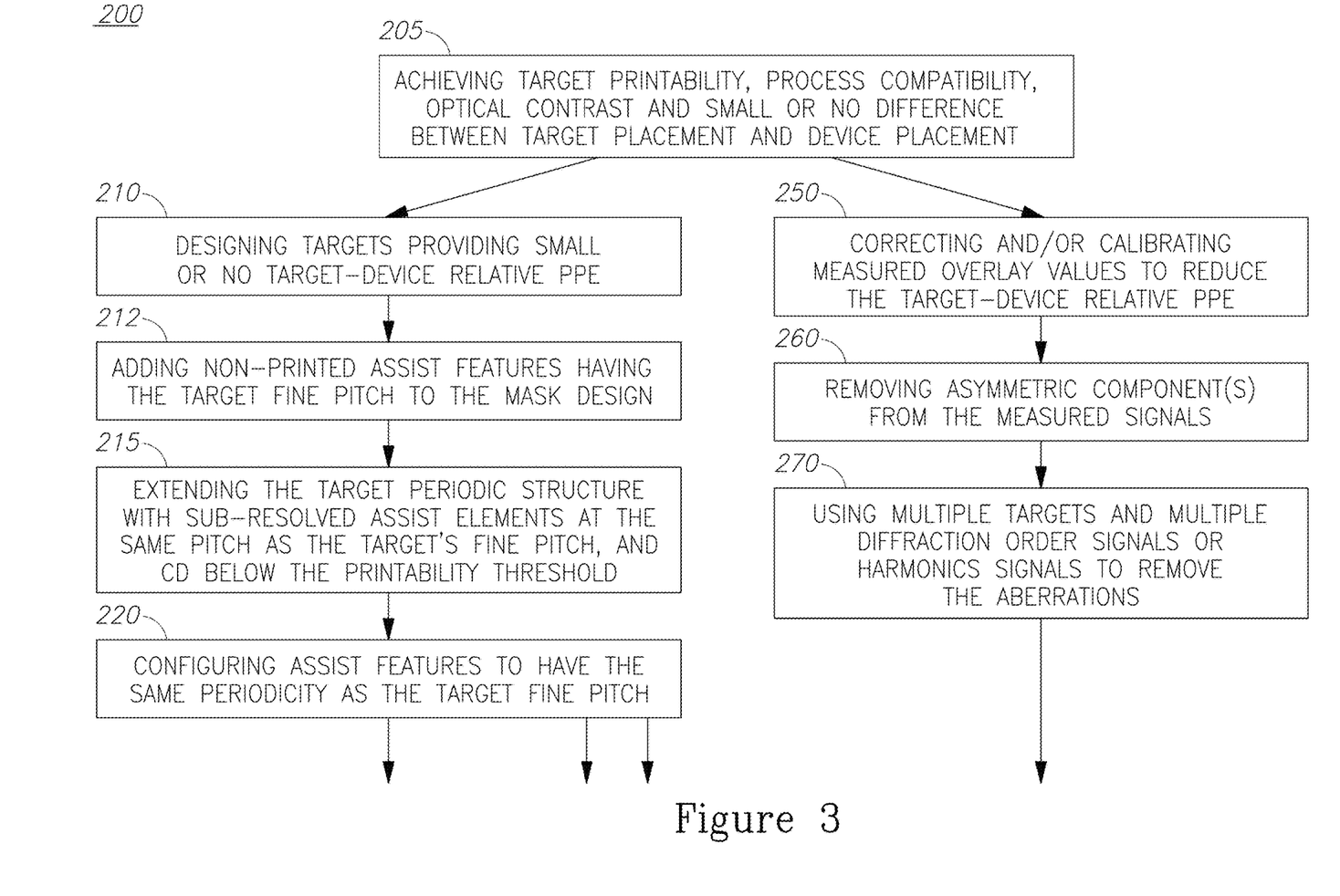
FIG. 3 is a high-level schematic flowchart illustrating a method, according to some embodiments of the invention.

FIG. 3 is a high-level schematic flowchart illustrating a method 200, according to some embodiments of the invention. Method 200 may be at least partially implemented by at least one computer processor, e.g., in a target design module and/or in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order, configured to achieve target printability, process compatibility, optical contrast and small pattern placement error, PPE and/or small or no PPE discrepancy between the devices and the corresponding targets (stage 205).

Method 200 may comprise designing targets providing small or no PPE discrepancy, or relative PPE between the devices and the corresponding targets (stage 210), according to any of the following embodiments. Method 200 may comprise comprising adding, to the mask design of target periodic structure(s), sub-resolved assist features at a same periodicity as, and in continuation of, the periodic structure(s) (stage 212), to extend the target periodic structure with sub-resolved assist elements at the same pitch as the target's fine pitch and having a CD (critical dimension)

smaller than a corresponding printability threshold (stage 215). Method 200 may comprise configuring assist features to have the same periodicity as the target fine pitch (stage 220). The dimensions of the SRAF assist features may be optimized to be the largest which is still below the printability threshold (see e.g., FIG. 2). The assist features may be configured e.g., by using the simulation approach or by using a special mask with arrays of printed targets to determine the printability threshold and limitations—such as special masks with regular printability verification procedures, FEM (Focus Exposure Matrix) wafers, CDSEM (critical dimension scanning electron microscope) etc. configured to determine the printability window.

In certain embodiments, method 200 may further comprise using optimized phase shift masks to minimize target asymmetry (stage 230). The phase shift masks may be optimized, e.g., using simulation(s) and/or empirical measurements, to minimize the aberrations-related asymmetry of the target, while maintaining the total shift similar to the device shift. Using various methods, the assist features may be selected or configured to minimize the CD variations, which together with selecting a fine segmentation pitch of the target elements which is equal to the device pitch, minimizes or eliminates the relative PPE between the devices and the corresponding targets. optimization may comprise e.g., OPC (optical proximity correction)-like optimization with the free parameters of the optimization including e.g., the number of mask features, their placement, each feature size and phase, etc.

In certain embodiments, method 200 may further comprise optimizing sub-resolved features to minimize target asymmetry (stage 235). For example, features on non-phase shift masks may be constructed using periodic structure(s) having sub-resolution pitch, which may actually behave similarly to phase shift masks, as derivable using the effective medium theory—see e.g., the application of the effective medium theory for focus offset targets in U.S. Patent Application Publication No. 2015/0309402, which is incorporated herein by reference in its entirety.

Figure 4:
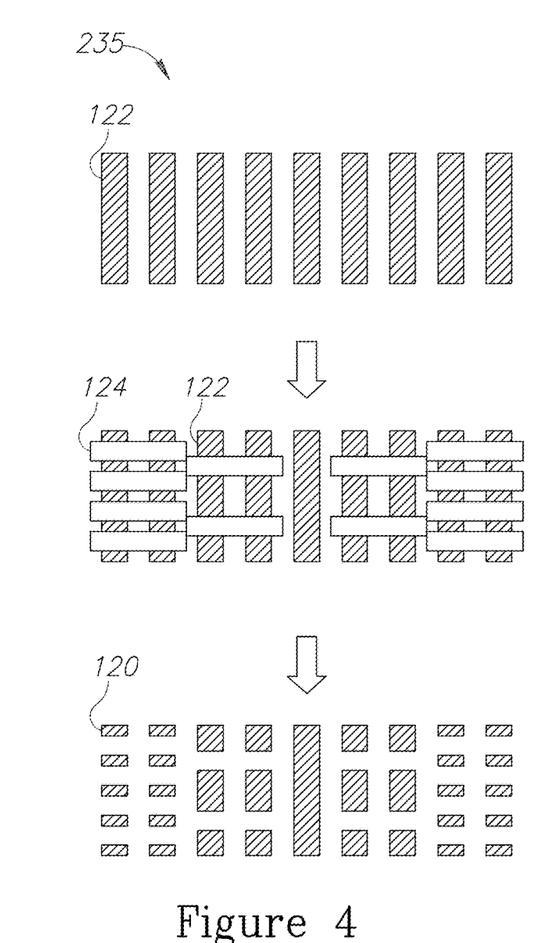
FIG. 4 is a high-level schematic illustration of an example for targets prepared by optimizing sub-resolved features to minimize target asymmetry, according to some embodiments of the invention.

FIG. 4 is a high-level schematic illustration of an example for targets 120 prepared by optimizing sub-resolved features to minimize target asymmetry 235, according to some embodiments of the invention. Targets 120 may be produced using an initial periodic structure 122, which may be device-based and have a minimal design rule pitch (e.g., between 80-150 nm, 30-100 nm or 10-50 nm, depending on the scanner technology) and applying a cutting procedure, illustrated schematically as cutting mask 124, to yield overlay target 120 for the process layer, in which target 120 has the smallest possible NZO (non-zero offsets), has no printability problems as the target structures are similar in dimensions to device structures and as there are no gaps in the pattern (e.g., no gaps larger than 100 nm)—making targets 120 process-compatible. As targets 120 also provide enough contrast for measurement optical tool, they are also adequate metrology targets.

In certain embodiments, method 200 may further comprise designing 1:1 Line:Space (L:S) ratio of the target (or approximately so, e.g., 0.9<L:S<1.1) and measuring the second harmonics (the interference of second and zeroth diffraction order signals without first orders) (stage 240). Applying similar considerations as for Equation 1, the scanner-aberration-induced term, which describes the phase difference between +2 and −2 diffraction orders due to CD variations caused by scanner aberrations, is proportional to $$\left\{\sum_n \Delta CD_n \cdot \sin\left(\frac{4\pi d_n}{P}\right)\right\} / \left\{\sum_n \overline{CD}_n \cdot \cos\left(\frac{4\pi d_n}{P}\right)\right\}.$$

The inventors conclude that, if the line:space ratio (L:S) is close to 1:1, the extreme features influence on the measured overlay is close to zero, as then $4d_n \approx P$, and this part of the signal does not contain the inaccuracy related to scanner aberrations. Therefore, metrology targets may be designed and/or selected to have a 1:1 L:S ratio of the target and so that the second harmonics include mainly the zeroth and second orders interference (that is the $-1^{st}$ and $+1^{st}$ orders interference part in the second harmonics is much smaller). Accordingly, the metrology measurements of such targets are carried out with respect to the second harmonics, and the expected inaccuracy (due to the extreme features difference) is reduced or removed (e.g., is close to, or equals zero).

Applying similar considerations to scatterometry overlay (SCOL) metrology, SCOL targets may be designed and/or selected to use second diffraction order signals instead of the first diffraction order signals to minimize the impact of asymmetries such as ones related to scanner aberrations.

Method 200 may comprise correcting and/or calibrating measured overlay values to reduce PPE discrepancy and/or PPE value (stage 250) to remove the asymmetric component from the measurements. The following provides example(s) for the calibration procedures. Targets comprise periodic structures having well-established first and second harmonics (or any other pair of harmonics) and are produced on at least two wafers with different known aberrations $A^1$ and $A^2$. Metrology measurements may include measuring the overlay using first harmonics only to yield $OVL_1$ and measuring the overlay using second harmonics only to yield $OVL_2$ on the at least two wafers. The harmonics may be measured using different setups (with respect e.g., to spectrum, focus, etc.).

Equation 2 expresses the difference between the overlays on different wafers, assuming that it is due to scanner aberrations only, with $PPE_i$ denoting the PPE of the $i^{th}$ harmonic and RealOffset denoting the real offset.

$$\text{DiffOverlay}_{i^{th}harmonics}^{wafer1,wafer2} = \text{RealOffset} + PPE_i = \text{RealOffset}(A^1 - A^2) + F_i(A^1 - A^2) \quad \text{Equation 2}$$

In the calibration process, if RealOffset is small (e.g., upon verification using simulation), it may be neglected, otherwise, RealOffset may be learned using the lithography simulation (e.g., even the aerial image simulation of dense periodic structure with a pitch and CD designed according to the fine pitch and fine CD of the target—may suffice for the learning). Alternatively or complementarily, method 200 may comprise learning $PPE_i$ using, e.g., measurement simulation, according to Equation 2A—to yield the sensitivity of the measurement to the asymmetry caused by the scanner asymmetric aberrations, which may be learned using lithography simulations. F denotes the slope of the measurement error of the $i^{th}$ harmonic due to aberration and is estimated empirically.

$$PPE_i = F_i(A^1 - A^2) = \text{DiffOverlay}_{i^{th}harmonics}^{wafer1,wafer2} - \text{RealOffset}(A^1 - A^2) \quad \text{Equation 2A}$$

From Equation 2A, the calibration constant $$R_{i,j} = \frac{F_i}{F_i - F_j}$$

may be learned in a training phase, with respect one or more parameters such as the harmonic, the wavelength, the grating etc. During runtime, when measuring a new site and/or wafer having an unknown aberration A expressed as $$A = \frac{D}{F_i - F_j}$$

with D expressed in Equation 3 and providing the corrected overlay expressed in Equation 4.

$$D = OVL_i - OVL_j = PPE_i - PPE_j = (F_i - F_j)A \quad \text{Equation 3}$$

$$OVL = OVL_i - PPE_i = OVL_i - R \cdot D \quad \text{Equation 4}$$

In certain embodiments, the calibration presented above may be carried out using different wavelengths instead of, or in addition to harmonics.

Applying similar considerations to SCOL metrology, SCOL targets may be constructed to provide the second order and first order diffraction signals, and SCOL measurements may be configured to provide at least two separate overlay measurements to which the above procedures may be implemented, e.g., using any of different diffraction orders, different wavelengths and/or different parts of pupil plane.

In certain embodiments, method 200 may further comprise removing asymmetric component(s) from the measured signals (stage 260).

In certain embodiments, method 200 may further comprise using multiple targets and metrology signals (such as diffraction orders for scatterometry measurements and harmonics signals for imaging measurements) to remove the aberrations (stage 270). Method 200 may further comprise deriving, from targets and signals, a PPE correction related to asymmetric aberrations, by applying a learning procedure to a calibration term (stage 272), with learning procedure being carried out, e.g., according to Equations 2-4, and possibly method 200 comprises reiterating the derivation (stage 274) to calibrate the metrology measurements. In certain embodiments, method 200 may further comprise adjusting corresponding measurements by the PPE correction (stage 276).

In certain embodiments, method 200 may further comprise using targets with multiple periodic structures in the same layer (stage 280), with the periodic structures configured to provide the PPE correction upon measurement. The periodic structures may be identical or differ in pitch and/or CD. Method 200 may further comprise producing the multiple target structures in one layer by applying a cutting procedure to a periodic structure at a minimal design rule pitch to yield periodic structures of different pitches and CD's (stage 290), Embodiments of method 200 may be applied to scatterometry and/or imaging metrology, depending on the specific configuration of targets and measurement procedures.

Figure 5:
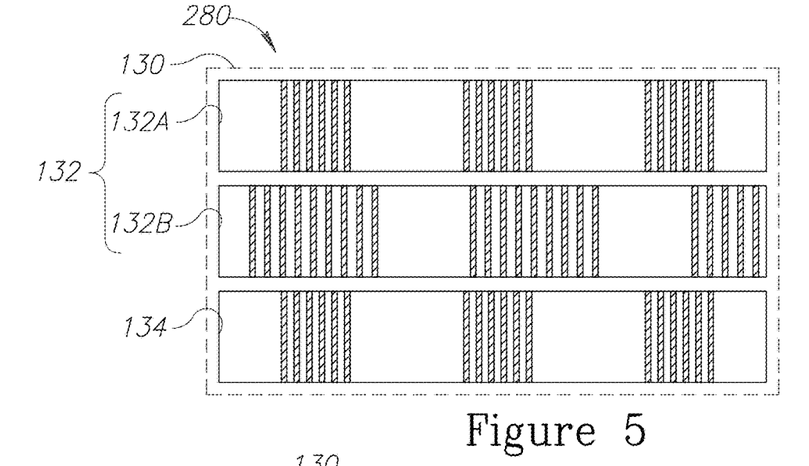
FIG. 5 is a high-level schematic illustration of targets with multiple periodic structures in the same layer, according to some embodiments of the invention.

FIG. 5 is a high-level schematic illustration of targets 130 with multiple periodic structures in the same layer (stage 280), according to some embodiments of the invention. Certain embodiments comprise the following calibration method and targets designed according thereto.

Targets 130 may comprise at least two periodic structures in at least one same layer. For example, targets 130 may comprise a Triple AIM or equivalent target having three pairs of periodic structures in each measurement direction, which is modified to have two of its gratings printed on the same layer (see e.g., FIG. 6 below). The periodic structures in the same layer(s) may be similar or different by design, for example having different coarse pitches, and/or possibly, in some cases, different fine segmentation pitches (e.g., segmentation pitches 96 nm and 160 nm), and distinctly different responses to the scanner aberrations. When similar, the periodic structures may have the same geometrical asymmetry (e.g., have same fine CD and same fine Pitch) to make the measurements independent of the type of asymmetric aberration, and therefore the asymmetric response invariant and the learned constants the same for all aberration and aberration-like PPEs. The coarse pitch and CD may be optimized using any of Equation 1, tool simulation and/or empirically, e.g., to amplify the difference in the measured overlay response between the periodic structures. Alternatively or complementarily, the designs of the periodic structures may be configured to have proportional asymmetry which may possibly be verified e.g., using simulation of lithography and/or process. In certain embodiments, the at least two periodic structures may be different in any of: the coarse CD, the coarse pitch, the span of the segmentation (some of which may be removed in one or more periodic structures)—to amplify the difference in the measured overlay response between the periodic structures—as indicated by Equation 1. In certain embodiments, the targets may be produced and measured on at least two wafers, e.g., having different known aberrations $A^1$ and $A^2$. Referring to FIG. 5, targets 130 may comprise two or more periodic structures 132A, 132B in the same (at least one) layer, e.g., in a previous layer 132, and additional periodic structure(s) 134 in one or more other layer(s), e.g., in a current layer 134. As discussed above, periodic structures 132A, 132B may differ in any of their parameters (CD, pitch, extent and dimensions) or comprise similar structures.

In certain embodiments, the measurements of targets 130 having at least two periodic structures in at least one same layer may be carried out according to the principles outlined above (Equations 2-4) and provided below. The overlay between two layers may be measured using grating F to provide $OVL_1$ and using grating S to provide $OVL_2$ on both wafers (having different known aberrations $A^1$ and $A^2$). The measurement may be carried out using different setups (spectrum, focus, etc.) and using any algorithm. The processing may be carried out according to Equation 2, with PPE denoting the PPE of the $i^{th}$ grating and with RealOffset neglected if small or learned using the lithography simulation and/or Equation 2A as disclosed above. The calibration constant $$R = \frac{F_i}{F_i - F_j}$$

may be defined and learned using e.g., the first harmonics (or diffraction orders in case of scatterometry measurements) to use measurements which are less sensitive to process variations than higher and/or multiple harmonics (because the process variation changes the ratio between the amplitudes of different harmonics in the measured signal). Measuring some new site(s) and/or wafer(s) with unknown aberration A may be carried out using Equations 3 and 4.

Applying similar considerations to SCOL measurements, two or more different SCOL targets may be used, which have different target designs in one or more layer(s) and similar target designs in another one or more layer(s), using similar algorithms and carrying out the calibration according to the principles outlined above (Equations 2-4), with R learned using e.g., measurement tool simulation or using Equation 2.

In certain embodiments, calibration may be carried out by optimizing the illumination parameters such as spectrum and focus to achieve minimal topographic phase for each harmonic, possibly for each site and/or for each layer, as disclosed e.g., in U.S. Patent Application Publication No. 2017/0146915, which is incorporated herein by reference in its entirety. The optimization may be carried out by scanning the illumination setup (e.g., spectrum, focus), on each site, and for each periodic structure (e.g., grating), in the vicinity of the periodic structure and identifying the illumination setup (e.g., wavelength) with zero (or near zero) topographic phase for each harmonics; and then measuring the corresponding periodic structure and the corresponding harmonics using the identified setup (e.g., wavelength and focus position).

Figure 6:
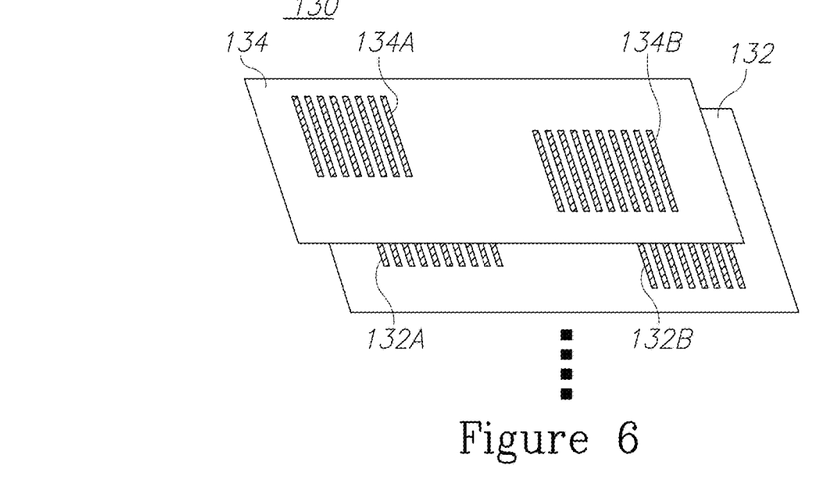
FIG. 6 is a high-level schematic illustration of targets with multiple periodic structures in two or more layers, according to some embodiments of the invention.

FIG. 6 is a high-level schematic illustration of targets 130 with multiple periodic structures in two or more layers, according to some embodiments of the invention. Certain embodiments comprise quadruple AIM targets 130, or equivalent targets, having four pairs of periodic structures in each measurement direction, with possibly at least two periodic structures 132A, 132B and 134A, 134B in each of at least two layers 132 and 134, respectively, such as the previous and current layers, respectively. Targets 130 may be used to measure and remove the asymmetric effects, such as scanner aberrations, from both previous and current layers 134, 132, simultaneously. Certain embodiments comprise multilayer targets 130 may be constructed (indicated schematically as optional additional layers below previous layer 132), with multiple periodic structures per two or more of the layers.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of reducing a difference between a device pattern position and a target pattern position of at least one periodic structure in a corresponding metrology target, the method comprising:
adding, to a mask design of the at least one periodic structure, at least two sub-resolved assist features at a same periodicity as, and adjacent on opposite sides of, the at least one periodic structure, wherein the sub-resolved assist features have a critical dimension (CD) smaller than a corresponding printability threshold, wherein the at least one periodic structure includes a plurality of elements, and wherein the at least two sub-resolved assist features include a plurality of second elements; and
measuring an interference from at least a first harmonics of the metrology target.

2. The method of claim 1, further comprising using optimized phase shift masks to minimize target asymmetry.

3. The method of claim 2, wherein the phase shift masks are optimized using simulation results of optical proximity corrections for the metrology target.

4. The method of claim 1, further comprising optimizing the sub-resolved assist features to minimize target asymmetry by deriving a maximal pitch therefor which is below a printability threshold.

5. The method of claim 4, wherein the optimizing is carried out using simulations.

6. The method of claim 1, further comprising measuring from the metrology target second harmonics comprising an interference of second and zeroth diffraction order signals.

7. The method of claim 1, applied to imaging metrology and corresponding targets.

8. The method of claim 7, wherein the elements of the at least one periodic structure are further segmented at a fine pitch.

9. The method of claim 1, applied to scatterometry metrology and corresponding targets.

10. The metrology target designed according to the method of claim 1.

11. The method of claim 1, wherein the elements and the second elements are printed lines.

* * * * *